(12) United States Patent
O'Donnell

(10) Patent No.: US 7,003,416 B1
(45) Date of Patent: Feb. 21, 2006

(54) METHOD AND A DEVICE FOR MONITORING THE PERFORMANCE OF TEST APPARATUS FOR TESTING COMPONENTS

(75) Inventor: John Gerard Martin O'Donnell, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 8 days.

(21) Appl. No.: 10/818,522

(22) Filed: Apr. 5, 2004

(51) Int. Cl.
*G01R 25/00* (2006.01)
*G01R 29/02* (2006.01)

(52) U.S. Cl. .................... 702/79; 702/108; 702/176; 700/306

(58) Field of Classification Search ............... 702/79, 702/108, 117–119, 176–179, 182, 187; 368/89, 368/107, 113; 700/306
See application file for complete search history.

(56) References Cited

U.S. PATENT DOCUMENTS 6,308,108 B1 * 10/2001 Michiwaki et al. ......... 700/195

* cited by examiner

Primary Examiner—Marc S. Hoff

(74) *Attorney, Agent, or Firm*—Wolff, Greenfield & Sacks, P.C.

(57) ABSTRACT

A method for monitoring the performance of a test apparatus (1) for testing a batch of integrated circuits. The apparatus 1 comprises a test site 2 in which the integrated circuits are sequentially tested, and a microprocessor (4) for carrying out the appropriate tests on the integrated circuits. A first ROM (5) stores a computer programme for controlling the operation of the microprocessor (4) for carrying out the tests, and a first RAM (10) stores a computer programme for controlling the operation of the microprocessor (4) for monitoring the performance of the test apparatus (1). In particular, the computer programme stored in the first RAM (10) operates the microprocessor (4) for computing the test time period for each integrated circuit tested, and also for computing the intervening time periods between each integrated circuit tested. The intervening time periods between the respective test time periods are classified as either first or second category delays or index time periods. An index time is the normal time required between tests. A first category time delay is one which exceeds thirty seconds, while a second category time delay is one which lies between four seconds and thirty seconds. The duration of the first and second category time delays are stored in a second RAM (18), and cross-referenced with the times at which the respective first and second category time delays terminated. This permits analysis of the time delays by category and time of occurrence for facilitating subsequent investigation and corrective action.

41 Claims, 2 Drawing Sheets

Figure 1:
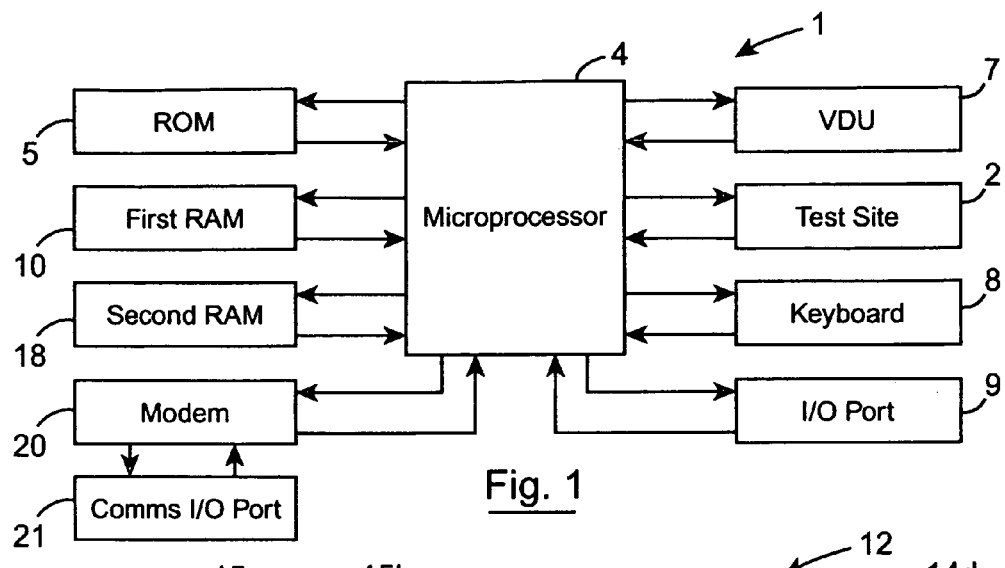

METHOD AND A DEVICE FOR MONITORING THE PERFORMANCE OF TEST APPARATUS FOR TESTING COMPONENTS

FIELD OF THE INVENTION

The present invention relates to a method and a device for monitoring the performance of test apparatus in testing components, and the invention also relates to a computer programme for carrying out the method, and to the test apparatus operating under the control of the computer programme for monitoring the performance of the test apparatus in testing components.

BACKGROUND TO THE INVENTION

Testing of components in a production process is an important part of the production process, and depending on the type of components being produced, the testing may take the form of a one hundred percent test, where each and every component produced is tested, or the testing may be carried out on a sampling basis, where only some of the components produced are tested, and the components to be tested are chosen randomly.

However, in both cases whether the testing of the components is carried out on the basis of a one hundred percent test or on a sampling basis, the testing of the components should be carried out efficiently without delays in order to maximise the efficiency of the entire production process. Efficiency in the testing of components is particularly important where one hundred percent of the components are to be tested.

In the production of integrated circuits, one hundred percent testing is required. Test apparatus for testing integrated circuits are known. Such test apparatus, in general, carry out a plurality of tests on each integrated circuit during testing of the integrated circuit. In general, the individual tests on the integrated circuit are carried out sequentially. At the end of testing of each integrated circuit, the integrated circuit is either passed or failed. However, due to the need to carry out one hundred percent testing on integrated circuits, it is essential that the test apparatus should operate efficiently during the testing, and in particular, should operate with delays between the testing of the respective integrated circuits minimised.

Known test apparatus output a large volume of data relating to the testing of the integrated circuits. However, in general, such data relates to the results of the tests carried out on the integrated circuits, and the reason why integrated circuits were passed or failed, and while such test apparatus may output data indicating the number of integrated circuits tested, as well as the number of integrated circuits passed and failed, such test apparatus provide little or no data which would permit a determination of the performance of the test apparatus in testing the integrated circuits to be made. Thus, without physically watching the operation of known test apparatus, it is virtually impossible to determine the performance of such apparatus.

There is therefore a need for a method and a device for monitoring the performance of test apparatus in testing components, and in particular, though not limited to such a method and device for monitoring the performance of test apparatus in testing integrated circuits.

The present invention is directed towards providing such a method and a device, and the invention is also directed towards providing a test apparatus in which the performance of the test apparatus in testing components can be monitored, and the invention is further directed towards providing a computer programme which is loadable into a computer or into a microprocessor of the test apparatus for monitoring the performance of the test apparatus in testing components.

SUMMARY OF THE INVENTION

According to the invention there is provided a method for monitoring the performance of test apparatus for testing components, the method comprising the steps of:
   reading the time at commencement of testing of each component by the test apparatus, reading the time at completion of testing of each component,
   computing the duration of intervening time periods between the time at completion of testing of each component and the time at commencement of testing of the next component,
   comparing the duration of each computed intervening time period with a first reference delay period, and if the duration of the intervening time period exceeds the first reference delay period, classifying the intervening time period as a first category delay,
   comparing the duration of each intervening time period which does not exceed the first reference delay period with a second reference delay period, the second reference delay period being less than the first reference delay period, and if the duration of the intervening time period is not less than the second reference delay period, classifying the intervening time period as a second category delay,
   storing the durations of each first and second category delay and the time at termination of each first and second category delay as being the time at commencement of testing of the next component to be tested after termination of the respective first and second category delays, the duration, termination time and category of each first and second category delay being cross referenced.

In one embodiment of the invention the duration of the second reference delay period is selected to be a function of the normal time duration required between completion of the testing of one of the components and the commencement of testing of the next following component for facilitating transfer of a tested component from the test apparatus and loading of the next following component to be tested into the test apparatus. Preferably, the duration of the second reference delay period is selected to be just greater than the normal time duration required between completion of the testing of one of the components and the commencement of testing of the next following component for facilitating transfer of a tested component from the test apparatus and loading of the next following component to be tested into the test apparatus.

In another embodiment of the invention the duration of each intervening time period which is less than the second reference delay period is classified as an index time period. Preferably, the mean duration of the index time periods is sequentially computed at the end of the respective intervening time periods which are classified as index time periods, and the current computed mean index time period is stored over the previously stored mean index time period.

In another embodiment of the invention the method comprises the further step of reading the time at commencement of testing of a batch of the components, computing a set-up time period for the test apparatus for the batch of the components, the set-up time period being computed as being a time period from the time at commencement of testing of the batch of the components up to the time at completion of testing of the first of the components tested to be passed as complying with the requirements for which the components are being tested, and storing the computed set-up time period. Preferably, the time at commencement of testing of the batch of the components is stored. Advantageously, the number of the components tested during the set-up time period is computed, and the computed number of the components tested during the set-up time period is stored.

In one embodiment of the invention the duration of a test time period for each component tested and passed is computed, the test time period for each component passed being computed as the time from the time at commencement of testing of the component to the time at completion of testing of the component. Preferably, the mean duration of the test time periods for components passed is sequentially computed at the end of the respective test time periods, and the current computed mean test time period for components passed is stored over the previously stored mean test time period for components passed. Advantageously, the mean test time period for the components tested and passed is computed from the commencement of testing of a batch of the components.

In another embodiment of the invention the current number of components tested and passed is computed and stored. Preferably, the current number of components tested and passed is computed as the number of components tested and passed since the commencement of testing of a batch of the components.

In a further embodiment of the invention the duration of a test time period for each component tested and failed is computed, the test time period for each component failed being computed as the time from the time at commencement of testing of the component to the time at which the component is failed, and testing of the component is terminated. Preferably, the mean duration of the test time periods for components failed is sequentially computed at the end of the respective test time periods, and the current computed mean test time period for components failed is stored over the previously stored mean test time period for components failed. Advantageously, the mean test time period for the components tested and failed is computed from the commencement of testing of a batch of the components.

Preferably, the current number of components tested and failed is computed and stored. Advantageously, the current number of components tested and failed is computed as the number of components tested and failed since the commencement of testing of a batch of the components.

In one embodiment of the invention the current number of components tested is computed and stored. Preferably, the current number of components tested is computed as the number of components tested since the commencement of testing of a batch of the components.

In another embodiment of the invention the time to complete testing of the components not yet tested of a batch of the components is computed based on the number of components tested during a prior predetermined time period. Preferably, the prior predetermined time period is a time period which terminated immediately before computation commenced of the number of components tested during the prior predetermined time period.

Preferably, the data stored by the method is stored for ready retrieval. Advantageously, the data stored by the method is stored for subsequent analysis. Ideally, the data stored by the method is stored in comma separated value format.

In one embodiment of the invention the time at commencement of testing of each component is read from the test apparatus, and the time at completion of the testing of each component is read from the test apparatus.

In another embodiment of the invention the number of components tested is computed from data read from the test apparatus, and preferably, the number of components passed by the test apparatus is computed from data read from the test apparatus, and advantageously, the number of components failed by the test apparatus is computed from data read from the test apparatus.

In one embodiment of the invention the data stored by the method is stored in a local directory of the test apparatus.

In another embodiment of the invention the method is for monitoring the performance of test apparatus for testing integrated circuit components.

In a further embodiment of the invention the test apparatus comprises a plurality of test sites for simultaneously testing a corresponding number of components.

In a still further embodiment of the invention the data for each test site is stored separately and is cross-referenced with the test site.

In one embodiment of the invention the test time period varies, depending on the number of components being tested simultaneously in the respective test sites, and the method further stores the test time periods cross-referenced with the number of components being simultaneously tested.

The invention also provides a computer programme product directly loadable into the internal memory of a computer comprising software code portions for performing the steps of the method according to the invention for monitoring performance of test apparatus in testing components when the computer programme product is run on a computer.

The invention also provides a computer programme product stored on a computer usable medium comprising computer readable programme means for causing a computer to perform the steps of the method according to the invention for monitoring the performance of test apparatus in testing components.

Further the invention provides a computer readable medium, having a computer programme recorded thereon wherein the computer programme is for making a computer execute the method according to the invention for monitoring the performance of test apparatus in testing components.

The invention also provides a computer programme product directly loadable into the internal memory of a test apparatus for testing components, the computer programme product comprising software code portions for performing the steps of the method according to the invention for monitoring performance of the test apparatus in testing the components when the computer programme product is run on the test apparatus.

Further the invention provides a computer programme product stored on a computer usable medium comprising computer readable programme means for causing a test apparatus to perform the steps of the method according to the invention for monitoring the performance of test apparatus in testing components.

The invention also provides a computer readable medium, having a computer programme recorded thereon wherein the programme is for making a test apparatus for testing components execute the method according to the invention for monitoring the performance of test apparatus in testing components.

Additionally the invention provides a device for monitoring the performance of test apparatus in testing components, the device comprising a reading means for reading the time at commencement of testing of each component by the test apparatus, and for reading the time at completion of testing of each component, a computing means for computing the duration of intervening time periods between the time at completion of testing of each component and the time at commencement of testing of the next component, a first comparing means for comparing the duration of each computed intervening time period with a first reference delay period, a first means for classifying each computed intervening time period as a first category delay in response to the first comparing means determining that the duration of the intervening time period exceeds the first reference delay period, a second comparing means for comparing the duration of each computed intervening time period which does not exceed the first reference delay period with a second reference delay period, the second reference delay period being less than the first reference delay period, a second means for classifying each computed intervening time period as a second category delay in response to the second comparing means determining that the duration of the intervening time period is not less than the second reference delay period, and a storing means for storing the duration of each first and second category delay and the time at termination of each first and second category delay as being the time at commencement of testing of the next component to be tested after termination of the respective first and second category delays, the duration, termination time and category of each first and second category delay stored in the storing means being cross-referenced.

Additionally the invention provides test apparatus for testing components, the test apparatus comprising a microprocessor for controlling the test apparatus during testing of the components, and a storing means for storing a computer programme for operating the microprocessor for carrying out the method according to the invention for monitoring the performance of the test apparatus in testing the components.

ADVANTAGES OF THE INVENTION

The advantages of the invention are many. The method according to the invention permits the performance of test apparatus in testing components to be readily and easily monitored. Additionally, by reading out the stored data which is stored by the method according to the invention, a determination of the performance of the apparatus can readily easily be made. Additionally, by virtue of the fact that the stored data is stored for retrieval, the data can readily easily be retrieved for both current and subsequent analysis. By virtue of the fact that the data is stored in comma separated value format, the data can readily be read into existing data analysis computer software and spreadsheets, graphs, pie charts and the like which facilitate analysis of the performance of the test apparatus can readily easily be prepared. Additionally, the data stored by the method according to the invention can readily easily be displayed on existing computer systems, and furthermore, the data can be read over the internet and analysed remotely.

By virtue of the fact that the method stores delays between testing of each component and the next component to be tested, and furthermore, that the delays are categorised, lengthy delays, and the times at which they occur can readily easily be identified. By virtue of the fact that the delays are categorised into two categories and the times at which they occur are stored, the reasons for the delays can readily easily be investigated subsequently and the causes of the delays can be determined, thereby permitting corrective action to be taken in order to improve the performance of the test apparatus. Persistent delays of the different categories, can also be identified, and additionally, the times at which such delays occur can likewise be identified, and investigated, and then subsequent corrective action may be taken.

A further important advantage of the invention is that by virtue of the fact that the method determines the set-up time period, and also the number of components tested during the set-up time period, excessively long set-up time periods and excessively high numbers of components tested during the set-up time periods can readily easily be identified, and investigations as to the reasons for such excessively long set-up time periods and excessive numbers of components tested during set-up time periods can be made, and corrective action taken.

Another important advantage of the invention is provided by the fact that the method computes the time required to test the remaining components of a batch of the components not yet tested. By virtue of the fact that the time required to complete testing of the remaining components of the batch not yet tested is computed based on the number of components tested in a prior predetermined time period, which preferably, is just prior to the time at which the computation of the time required to complete testing of the batch is made, the computed time to complete testing of the batch of components is relatively accurate, since it is based on the current testing rate of the test apparatus.

Similar advantages are achieved from the device according to the invention, and when a computer programme according to the invention is loaded into a test apparatus for carrying out the method according to the invention within the test apparatus similar advantages to those just discussed are also achieved. Similar advantages are achieved when the computer programme is operating a computer which is communicating with the test apparatus.

Figure 2:
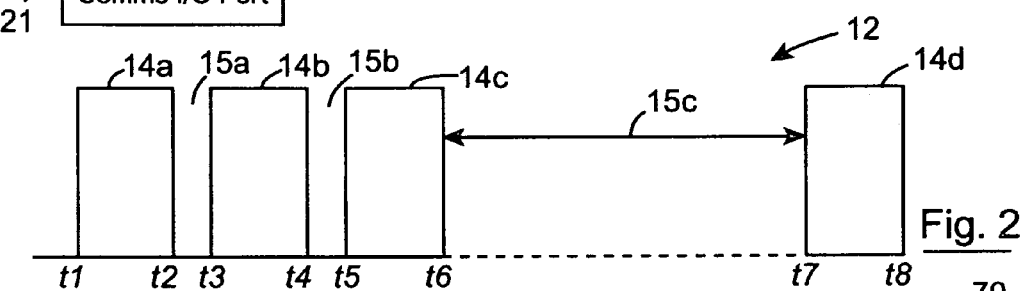
Figure 4:
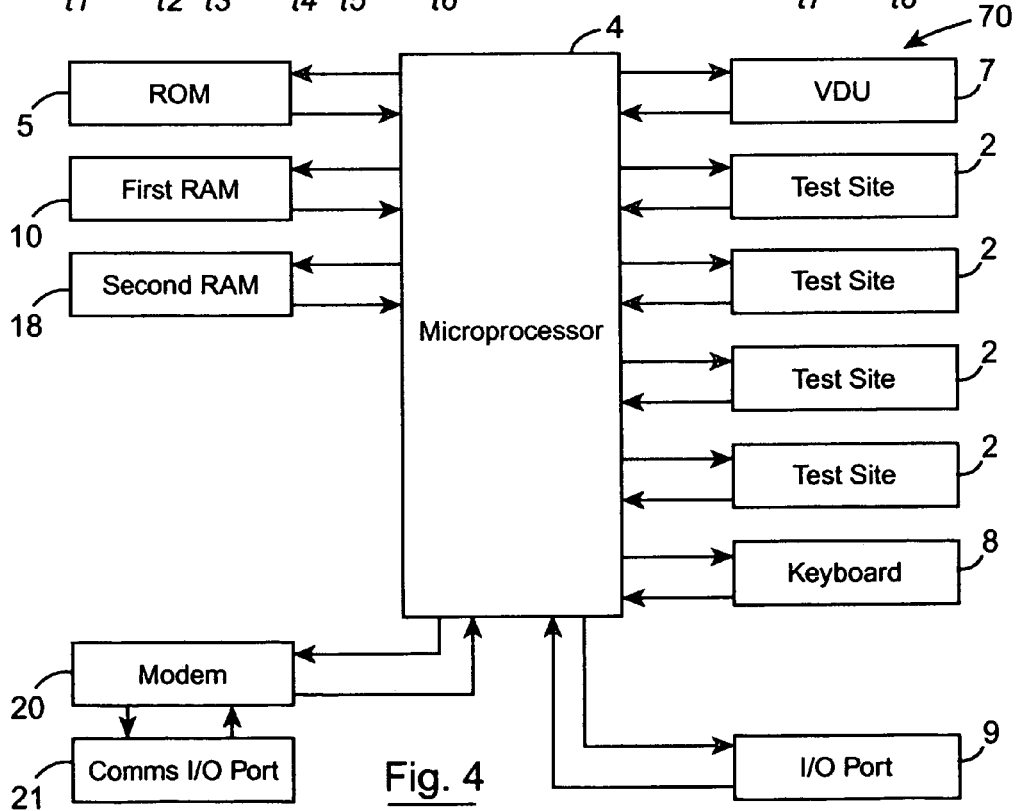
Figure 3:
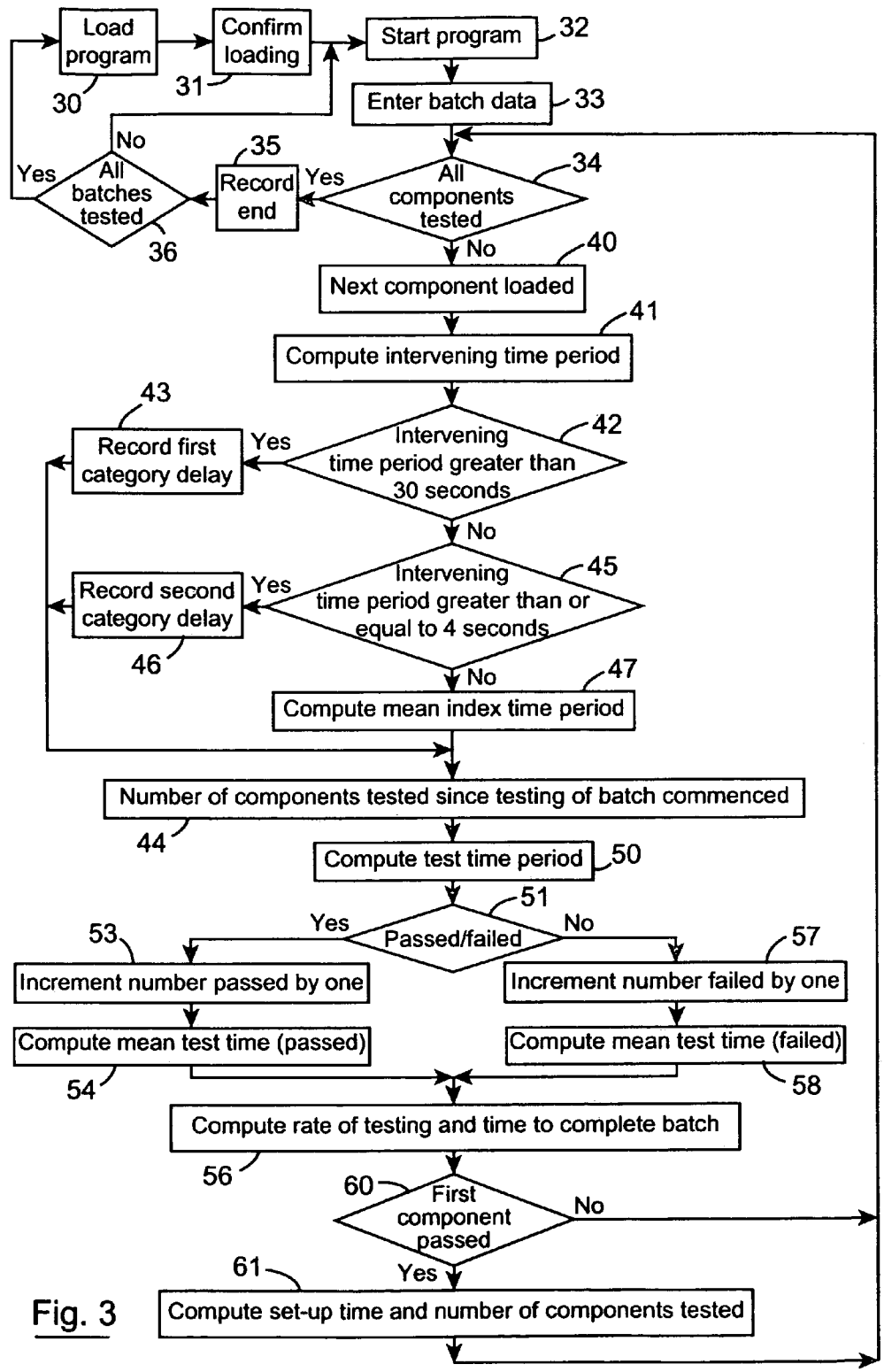

The invention and its many advantages will be readily apparent to those skilled in the art from the following description of some preferred embodiments thereof which are given by way of example only with reference to the accompanying drawings in which:

FIG. 1 is a block representation of a test apparatus according to the invention, FIG. 2 is a typical timing diagram of the operation of the test apparatus of FIG. 1 testing components, FIG. 3 is a flowchart illustrating the steps carried out by a method according to the invention for determining the performance of the test apparatus of FIG. 1 in testing components, and FIG. 4 is a block representation of test apparatus according to another embodiment of the invention.

Referring to the drawings and initially to FIGS. 1 to 3 there is illustrated test apparatus according to the invention indicated generally by the reference numeral 1 for testing components (not shown), which in this embodiment of the invention are integrated circuits. The test apparatus 1 comprises a single test site 2 into which the integrated circuits to be tested are sequentially loaded. Accordingly, in this embodiment of the invention the apparatus 1 is suitable for testing only one integrated circuit at a time, although, as will be well known to those skilled in the art, test apparatus which include a plurality of test sites for sequentially testing a plurality of integrated circuits simultaneously are known, and such a test apparatus is described with reference to FIG. 4.

A microprocessor 4 controls the operation of the test apparatus 1 for testing the integrated circuits under the control of a suitable computer programme which may be stored in the microprocessor 4 or in a read-only-memory (ROM) 5. As will be well known to those skilled in the art during testing of each integrated circuit in the test site 2, the integrated circuit is subjected to a plurality of individual tests for testing various aspects and functions of the integrated circuit. Some of the individual tests may be carried out sequentially, and others simultaneously. Typically, a plurality of stimulus signals are applied to the integrated circuit in the test site 2, and outputs from the integrated circuit in the test site 2 are read by the microprocessor 4. The microprocessor 4 under the control of the computer programme in the ROM 5 analyses the signals received from the integrated circuit, and typically compares the received signals with predetermined reference parameters. If the signals received from the integrated circuit compare favourably with the reference parameters, the integrated circuit is passed, otherwise, it is failed.

A visual display unit 7 is also provided for displaying data in respect of the integrated circuits tested in visual form. A keyboard 8 facilitates entry of commands to the microprocessor 4, as well as data such as the type of the integrated circuits to be tested, the batch number, the number of integrated circuits in the batch and other relevant data required for identifying the integrated circuits. An Input/Output (I/O) port 9 facilitates reading out test results of the integrated circuit from the microprocessor 4, and also facilitates entry of instructions and commands for selecting the appropriate tests to be carried out by the test apparatus 1 on the integrated circuits to be tested, as well as for inputting data identifying the integrated circuits by type, batch number and other relevant identification features. The microprocessor 4 of the test apparatus 1 also records the number of integrated circuits of a batch to have been tested, the number of integrated circuits of the batch passed, and the number of integrated circuits of the batch failed. This data is displayed on the visual display unit 7, and may also be read out through the I/O port 9.

The test apparatus 1 described up to this will be well known to those skilled in the art, and it is not intended to describe the test apparatus 1 or its operation in carrying out specific tests on integrated circuits in further detail.

The microprocessor 4 of the test apparatus 1 as well as operating under the control of the computer programme stored in the ROM 5 for testing the integrated circuits, also operates under the control of a computer programme according to the invention, which operates in accordance with a method according to the invention, and which is stored in a first random access memory (RAM) 10 of the test apparatus 1. The computer programme stored in the first RAM 10 controls the operation of the microprocessor 4 during testing of a batch of integrated circuits, for monitoring the performance of the test apparatus 1 in testing the batch of integrated circuits. A second RAM 18 is provided for storing data read and computed by the microprocessor 4 under the control of the computer programme in the first RAM 10. A modem 20 and a telecommunications I/O port 21 are provided for remotely accessing the data stored in the second RAM 18, via a telecommunications network, the internet or any other suitable remote accessing arrangement. Before describing the method steps carried out by the computer programme for monitoring the performance of the test apparatus 1, a timing diagram 12 of FIG. 2 which illustrates typical operation of the test apparatus 1 during testing of the integrated circuits will first be described.

Referring to FIG. 2, test time periods during which the integrated circuits are sequentially tested in the test apparatus 1 are illustrated in the timing diagram 12 by blocks 14. Intervening time periods between the test time periods 14 are illustrated by spaces 15 between the test time periods 14. For convenience four test time periods 14 are illustrated and are identified by the reference numerals 14a, 14b, 14c and 14d. The intervening time periods 15 are identified by the reference numerals 15a, 15b and 15c. Each test time period 14 is the time during which a corresponding integrated circuit is being tested. In other words, time $t_1$ is the time at commencement of testing of the integrated circuit which was tested during the test time period 14a. Time $t_2$ is the time at completion of testing of the integrated circuit which was tested during the test time period 14a. Time $t_3$ is the time at commencement of testing of the integrated circuit which was tested during the test time period 14b, time $t_4$ is the time at completion of testing of the integrated circuit which was tested during the test time period 14b, and so on up to time $t_8$ which is the time at completion of testing of the integrated circuit being tested during the test time period 14d.

The length of the intervening time periods 15 between the test time periods 14, in other words, the intervening time periods from time $t_2$ to time $t_3$, from time $t_4$ to time $t_5$, and from time $t_6$ to time $t_7$ is dependent on various circumstances. The intervening time periods 15a and 15b are relatively short, and are accounted for by the time which is required to transfer a tested integrated circuit from the test site 2 and to load the next integrated circuit to be tested into the test site 2, and these intervening time periods 15a and 15b are referred to as index time periods, in other words, the time required to index from testing one integrated circuit to the next. In this embodiment of the invention the time required between the test time periods to transfer a tested integrated circuit from the test site 2 and to load the next integrated circuit is less than four seconds. Accordingly, the microprocessor 4 operating under the control of the computer programme in the first RAM 10 classifies any intervening time period of less than 4 seconds as an index time period.

The intervening time period 15c from time $t_6$ to time $t_7$, is relatively long, and can only be accounted for by a delay. Since the test time periods 14 and the index time periods are substantially constant, it is therefore the intervening time periods 15 such as the delay between time $t_6$ and time $t_7$ which impact on the performance, and thus the efficiency of operation of the test apparatus 1. One of the important functions of the method according to the invention for monitoring the performance of the test apparatus 1 is to identify intervening time periods 15 which result from delays. In this embodiment of the invention the intervening time periods 15 of time equal to or greater than four seconds are classified as delays. The microprocessor 4 operating under the control of the computer programme in the first RAM 10 classifies the intervening time periods 15 which are equal to or greater than four seconds into two categories, namely, a first category delay, which is an intervening time period 15 greater than thirty seconds, and a second category delay which is an intervening time period 15 less than or equal to thirty seconds but greater than or equal to four seconds.

Under the control of the computer programme in the first RAM 10, the microprocessor 4 computes the duration of each intervening time period 15 from commencement of testing of the batch of integrated circuits. The microprocessor 4 under the control of the computer programme in the first RAM 10 compares the computed duration with first and second reference delay periods for classifying the intervening time periods 15 into first category delays, second category delays and index time periods. The first reference delay period is of thirty seconds, and the second reference delay period is of four seconds. If the intervening time period 15 exceeds the first reference delay period, the intervening time period is classified as a first category delay. If the intervening time period 15 is less than or equal to the first reference delay period, and is not less than the second reference delay period, the intervening time period is classified as a second category delay. Intervening time periods which are less than the second reference delay period are classified as index time periods. The duration of each first category delay is stored in the second RAM 18, and identified as a first category delay. The time at which each first category delay terminated is also stored in the second RAM 18, and is cross-referenced with the duration of the corresponding first category delay. The duration of each second category delay is stored in the second RAM 18, and identified as a second category delay. The time of termination of each second category delay is stored in the second RAM 18, and is cross-referenced with the duration of the corresponding second category delay.

With the durations of the first and second category delays stored and cross-referenced with their respective times of termination in the second RAM 18, the first and second category delays can be separately analysed, and the times at which they occurred can likewise be analysed. This, thus, permits subsequent investigation as to the cause of the delays, and thus permits appropriate corrective action to be taken in order to avoid or at least minimise such first and second category delays in future testing.

At the end of each intervening time period which is classified as an index time period, the microprocessor 4 under the control of the computer programme in the first RAM 10 computes the current mean duration of the index time periods, and the current mean index time period is stored in the second RAM 18 over the previously stored current mean index time period. Additionally, the number of index time periods since commencement of testing of the batch of the integrated circuits is stored over the previously stored number of index time periods, and is cross-referenced with the mean index time period.

The time of termination of each intervening time period, and thus the time of termination of each first and second category delay, and also the time of termination of each index time period is determined as being the time at commencement of testing of the next integrated circuit after the intervening time period. The time at commencement of each intervening time period 15, and thus the time at commencement of each first and second category delay, and also the time at commencement of each index time period is determined as being the time at completion of testing of the previous integrated circuit immediately before the intervening time period. The times at commencement and the times at completion of the test time periods 14 are read and obtained from data compiled by the microprocessor 4 when operating under the control of the computer programme stored in the ROM 5, and the times at commencement and at completion of the respective test time periods 14 are stored in the second RAM 18.

As well as storing the duration and termination times of the first and second category delays in the second RAM 18, the type of integrated circuit and batch lot number of the batch are also stored and cross-referenced with the duration and termination time of the first and second category delays for further facilitating subsequent investigation of the respective delays.

The computer programme in the first RAM 10 also operates the microprocessor 4 for computing the set-up time period required to set up the test apparatus for testing each batch of the integrated circuits, and the set-up time period is also stored in the second RAM 18, separately of the first and second category delays. The set-up time period is computed by the microprocessor 4 under the control of the computer programme in the first RAM 10 by subtracting the time of commencement of testing of the batch from the time at completion of testing of the integrated circuit of the batch which is first to be passed by the test apparatus. The number of integrated circuits tested during the set-up time period which includes the failed integrated circuits and the first integrated circuit passed during the set-up time period is computed by the microprocessor 4, and is also stored in the second RAM 18, separately of the first and second category delays. This, thus, permits analysis of the times required to set up the test apparatus 1 for different batches of the integrated circuits, and if a set-up time period is excessive and/or the number of integrated circuits tested during a set-up time period is excessive, appropriate corrective action may be taken.

The microprocessor 4 operating under the computer programme stored in the first RAM 10 at the time of completion of each test computes the number of integrated circuits tested in a just expired predetermined time period, and computes the current test rate at which the test apparatus 1 is testing the integrated circuits based on the number of integrated circuits tested in that just expired predetermined time period. The microprocessor 4 under the control of the computer programme stored in the first RAM 10 stores the current test rate in the second RAM 18 over the previously stored test rate. The time required to completion of testing of the remaining integrated circuits of the batch is computed based on the current test rate. The computed time to completion is stored in the second RAM 18, and is displayed on the visual display unit 7. In this embodiment of the invention the predetermined time period is fifteen minutes.

The microprocessor 4 operating under the control of the computer programme in the first RAM 10 computes the duration of each test time period 14, and at the end of each test time period 14 computes the current mean duration of the test time periods for the integrated circuits which have been passed, and the current mean duration of the test time periods for the integrated circuits which have been failed by the test apparatus. The mean pass test time and the mean fail test time periods are stored in the second RAM 18 over the previously stored current mean pass and fail test time periods, respectively. The current corresponding number of integrated circuits tested and passed, and the current corresponding number of integrated circuits tested and failed are stored over the previously stored current number of integrated circuits tested and passed, and failed, respectively, and are cross-referenced with the corresponding mean pass and mean fail test time periods. In this embodiment of the invention each mean pass test time period is computed based on the test time periods 14 of the integrated circuits tested and passed from the commencement of testing of the batch of integrated circuits. Each mean fail test time period is computed based on the test time periods 14 of the integrated circuits tested and failed from the commencement of testing of the batch of integrated circuits. When the test apparatus fails an integrated circuit, the test time period for that integrated circuit is terminated immediately after the integrated circuit has been deemed to have failed by the test apparatus 1. Additionally, at the end of each test time period, the number of integrated circuits tested since the commencement of testing of the batch is also computed and is stored over the previously stored number of integrated circuits tested and is cross-referenced with the stored current mean pass and fail test time periods.

Referring now to FIG. 3, a flowchart illustrating the steps of the method according to the invention carried out by the microprocessor 4 under the control of the computer programme stored in the first RAM 10 will now be described. Under block 30 the computer programme is loaded into the microprocessor 4, and under block 31 the microprocessor 4 confirms loading of the programme. Block 32 starts the computer programme running, and the computer programme moves to block 33. Relevant data regarding the batch of the integrated circuits to be tested is requested, and entered through the keyboard 8 and/or the I/O port 9 under the control of block 33. The data entered includes the type of the integrated circuits, the identification number of the batch, the number of integrated circuits in the batch, and if appropriate the tests to be carried out on the integrated circuits by the test apparatus 1. Although block 33 has been described as being part of the computer programme stored in the first RAM 10, typically, the data entered under block 33 will be entered under the control of the computer programme stored in the ROM 5, and will be read in from the data entered while the microprocessor 4 is operating under the control of the computer programme stored in the ROM 5.

After the data in respect of the batch of the integrated circuits has been entered or read in under block 33, testing of the batch of integrated circuits is ready to commence. On commencement of testing of the batch of integrated circuits, block 33 also stores the time at commencement of testing of the first of the integrated circuits of the batch to be tested in the second RAM 18, as being the time of commencement of testing of the batch. The computer programme then moves to block 34. Block 34 checks if all the integrated circuits of the batch have been tested, and if so the computer programme moves to block 35 which records the completion of the testing of the batch, and stores the time of completion of testing of the batch in the second RAM 18, as the time at completion of the test time period of the last of the integrated circuits of the batch to have been tested. The computer programme then moves to block 36 which checks if all batches of the particular type of the integrated circuits have been tested, and if so the computer programme moves to block 30, which permits the computer programme in the first RAM 10 to be reloaded for testing batches of different integrated circuits. If block 36 determines that a further batch of similar integrated circuits is to be tested, the computer programme is returned from block 36 to block 32, which has already been described.

Should block 34 determine that all the integrated circuits of a batch have not yet been tested, the computer programme moves to block 40. Block 40 checks if the next integrated circuit to be tested has been loaded into the test site 2, and if testing has commenced. If block 40 determines that testing of the next integrated circuit to be tested has commenced, block 40 reads the time at commencement of the test time period for that integrated circuit, and the time at commencement of the test time period is stored in the second RAM 18. If block 40 determines that the next integrated circuit to be tested has not been loaded into the test site 2, or if testing of the next integrated circuit to be tested has not yet commenced, the computer programme remains in block 40 until testing of the next integrated circuit commences. Once testing of the next integrated circuit commences, the time at commencement of the test time period of that integrated circuit is read and stored in the second RAM 18 by block 40, and the computer programme moves to block 41. Block 41 computes the duration of the intervening time period 15 between the just stored time at commencement of the test and the time at completion of the previous test. If the integrated circuit currently being tested is the first integrated circuit of a batch, the time period from the commencement of testing of the batch is computed by block 41. The duration of the intervening time period is computed by subtracting the time at completion of the previous test time period from the time at commencement of the current test time period. Once the duration of the intervening time period has been computed, the computer programme moves to block 42. Block 42 checks if the duration of the intervening time period has exceeded the duration of the first reference delay period, which in this case is thirty seconds, and if so the computer programme moves to block 43, which classifies the intervening time period as a first category delay. Block 43 stores the duration of the first category delay cross-referenced with the time of termination of the first category delay in the second RAM 18. The computer programme then moves to block 44, which will be described below.

Should block 42 determine that the intervening time period is not greater than the first reference delay period, the computer programme moves to block 45 which checks if the intervening time period is greater than or equal to the second reference delay period, namely, four seconds. If so, the computer programme moves to block 46 which classifies the intervening period as being a second category delay, and stores the duration of the second category delay cross-referenced with the time of termination of the second category delay in the second RAM 18. The computer programme then moves to block 44 which will be described below.

Should block 45 determine that the intervening time period is less than the second reference delay period, the computer programme moves to block 47 which determines that the intervening time period is an index time period. Under block 47 the microprocessor 4 computes the mean duration of the index time periods from the commencement of testing of the integrated circuits of the batch up to and including the current index time period. The computed mean index time period is stored in the second RAM 18 over the previously computed mean index time period by block 47, and block 47 also computes the current number of index time periods from the commencement of testing of the batch, and the current number of index time periods is also stored over the previously stored current number of index time periods.

The computer programme moves to block 44 from block 47. Block 44 checks if testing of the integrated circuit currently being tested has been completed, and the computer programme remains in block 44 until completion of testing of the integrated circuit. On completion of testing of the integrated circuit currently being tested, block 44 computes the number of integrated circuits tested since testing of the batch of integrated circuits commenced, and block 44 also reads the time at completion of the test time period of the integrated circuit just tested and stores the time at completion of the test time period in the second RAM 18. The computer programme then moves to block 50, which computes the test time period for the integrated circuit just tested by subtracting the time at commencement of the test time period from the time at completion of the test time period.

The computer programme then moves to block 51, which checks if the integrated circuit just tested has been passed or failed. If the integrated circuit just tested was passed, the computer programme moves to block 53 which increments the number stored in the second RAM 18 of integrated circuits passed since commencement of the testing of the batch of integrated circuits by one, and the computer programme moves to block 54. Block 54 computes the mean test time period of integrated circuits tested and passed from commencement of testing of the batch of integrated circuits, and stores the computed mean test time of integrated circuits passed over the previously stored mean test time period of integrated circuits which have been passed in the second RAM 18. The computer programme then moves to block 56, which will be described below. If block 51 determines that the just tested integrated circuit has been failed, the computer programme is moved from block 51 to block 57. Block 57 increments the number stored in the second RAM 18 of integrated circuits which have been failed since commencement of testing of the batch of integrated circuits by one, and the computer programme moves to block 58. Block 58 computes the mean test time period of integrated circuits failed from the commencement of testing of the batch of integrated circuits, and stores the just computed mean test time period of integrated circuits failed over the previously computed mean test time period for integrated circuits which have failed in the second RAM 18. The computer programme then moves from block 58 to block 56.

Block 56 determines the current rate of testing of the integrated circuits by the test apparatus, by determining the number of integrated circuits which have been tested in a predetermined time period which has just expired, and dividing the computed number of tested integrated circuits by the predetermined time period. In this embodiment of the invention the predetermined time period is fifteen minutes, and the predetermined time period is deemed to have terminated at the time of completion of testing of the just tested integrated circuit. The computed rate of testing of the integrated circuits is stored by block 56 in the second RAM 18 over the previously stored rate of testing. Block 56 also computes the time to complete testing of the batch based on the just computed rate of testing and the number of integrated circuits of the batch still to be tested, and stores the computed time to completion of testing of the batch over the previously stored time to completion in the second RAM 18.

The computer programme then moves to block 60 which checks if the integrated circuit just tested is the first of the integrated circuits of the batch to have been passed by the test apparatus, and if not, the computer programme is returned to block 34. If block 60 determines that the integrated circuit just tested is the first of the integrated circuits of the batch to have been passed by the test apparatus, the computer programme moves to block 61, which computes the set-up time and the number of integrated circuits tested during the set-up time. The set-up time is computed by subtracting the time at which testing of the batch of integrated circuits commenced from the time at completion of testing of the integrated circuit just passed. Block 61 also stores the computed set-up time and the number of integrated circuits tested during the set-up time in the second RAM 18. The computer programme is then returned from block 61 to block 34.

All data stored in the second RAM 18 is stored in a comma separated value format.

The stored data in the second RAM 18 can be read out directly through the I/O port 9, or remotely over a telecommunications network through the modem 20 and the telecommunications I/O port 21. The data stored in the second RAM 18 may be read out on a current time basis, or subsequently. Once read out analysis of the stored data can be readily carried out.

By virtue of the fact that the data is stored in the second RAM 18 in comma separated value format, the data can readily easily be read out from the second RAM 18 and incorporated in virtually any computer system and software for subsequent analysis. Additionally, the data in the comma separated value format can readily easily be incorporated into computer programmes for facilitating the preparation of spreadsheets, graphs, pie charts, and other visual techniques for visually presenting the data for facilitating analysing and determining the performance of the test apparatus 1. By virtue of the fact that the data stored in the second RAM is stored in comma separated value format, the data can be readily converted into other related databases for subsequent analysis.

By computing and storing the mean index time period, drifts in the mean index time period between tests of batches of similar integrated circuits can be identified and if necessary, corrective action taken. Similarly, by storing the mean test time for passed integrated circuits and the mean test time for failed integrated circuits, drift in the respective mean test times for passed and failed integrated circuits from batch to batch of similar integrated circuits can be detected and corrective action taken. By storing the set-up time and the number of integrated circuits tested during the set-up time of each batch of integrated circuits, drift in the set-up time and the number of integrated circuits tested in the set-up time from batch to batch of similar integrated circuits can readily be identified and corrective action taken. Additionally, where set-up times and the number of integrated circuits tested during the set-up times is excessive, appropriate investigations and corrective action can subsequently be taken.

By computing the rate of testing on a current time basis, the time to completion of testing of a batch of integrated circuits can readily easily be determined based on the current rate of testing, and the number of outstanding integrated circuits still to be tested.

As discussed above, by classifying delays which occur in the intervening time periods between respective test time periods into first and second category delays, facilitates ready identification of delays, the seriousness of the delays and the times at which they occurred, thereby facilitating subsequent investigation and appropriate corrective action.

Referring now to FIG. 4 there is illustrated a test apparatus according to another embodiment of the invention indicated generally by the reference numeral 70 for testing components, in this embodiment of the invention also integrated circuits. The test apparatus 70 is substantially similar to the test apparatus 1, and similar components are identified by the same reference numerals. The main difference between the test apparatus 70 and the test apparatus 1 is that the test apparatus 70 is a multi-site tester, and in this embodiment of the invention comprises four test sites 2. Thus; up to four integrated circuits can be simultaneously tested in the test apparatus 70. A computer programme for monitoring the performance of the test apparatus 70 is loaded into the first RAM 10. The computer programme is substantially similar to that already described. The only difference between the computer programme for the test apparatus 70 and that for the test apparatus 1 is that the computer programme loaded into the first RAM 10 of the test apparatus 70 takes account of the fact that the test apparatus 70 comprises a plurality of test sites. Thus, the second RAM 18 stores the data, which has already been described, in respect of the testing of each of the integrated circuits in the respective test sites 2. Additionally, the test time for each integrated circuit being tested varies depending on the number of integrated circuits being simultaneously tested in the respective test sites 2, and the test time period is at its maximum when all four test sites 2 are in use simultaneously. The computer programme in the first RAM 10 as well as determining the test time period for each integrated circuit being tested also records the number of integrated circuits being simultaneously tested against the corresponding test times. All the data computed by the computer programme in the first RAM 10 for each test site 2 is stored separately for the respective test sites in the second RAM 18. Otherwise, the test apparatus 70, and the computer programme for carrying out the method according to the invention for monitoring the performance of the test apparatus 70 is similar to the computer programme stored in the first RAM 10 of the test apparatus 1.

While the test apparatus and the method according to the invention have been described for testing integrated circuits, it will be readily apparent to those skilled in the art that the test apparatus and the method may be used for testing any integrated circuits, and the tests carried out on the integrated circuits may be electrical tests, or indeed, may be mechanical tests. Furthermore, it is envisaged that the test apparatus and the method according to the invention may be used for monitoring the performance of test apparatus for testing components, other than integrated circuits, for example, the test apparatus and the method may be used for monitoring the performance of apparatus for testing components, such as printed circuit boards, mechanical components, chemical products, or any other components.

Additionally, while one of the test apparatus has been described as comprising one test site and the other test apparatus has been described as comprising four tests sites, it will be readily apparent to those skilled in the art that the test apparatus according to the invention may include any number of test sites.

While a particular configuration of microprocessor and a ROM and RAMs have been described, any other suitable configuration may be used.

What is claimed is:

1. A method for monitoring the performance of test apparatus for testing components, the method comprising:
    reading the time at commencement of testing of each component by the test apparatus,
    reading the time at completion of testing of each component,
    computing the duration of intervening time periods between the time at completion of testing of each component and the time at commencement of testing of the next component,
    comparing the duration of each computed intervening time period with a first reference delay period, and if the duration of the intervening time period exceeds the first reference delay period, classifying the intervening time period as a first category delay,
    comparing the duration of each intervening time period which does not exceed the first reference delay period with a second reference delay period, the second reference delay period being less than the first reference delay period, and if the duration of the intervening time period is not less than the second reference delay period, classifying the intervening time period as a second category delay,
    storing the durations of each first and second category delay and the time at termination of each first and second category delay as being the time at commencement of testing of the next component to be tested after termination of the respective first and second category delays, the duration, termination time and category of each first and second category delay being cross-referenced.

2. A method as claimed in claim 1 in which the duration of the second reference delay period is selected to be a function of the normal time duration required between completion of the testing of one of the components and the commencement of testing of the next following component for facilitating transfer of a tested component from the test apparatus and loading of the next following component to be tested into the test apparatus.

3. A method as claimed in claim 2 in which the duration of the second reference delay period is selected to be just greater than the normal time duration required between completion of the testing of one of the components and the commencement of testing of the next following component for facilitating transfer of a tested component from the test apparatus and loading of the next following component to be tested into the test apparatus.

4. A method as claimed in claim 1 in which the duration of each intervening time period which is less than the second reference delay period is classified as an index time period.

5. A method as claimed in claim 4 in which the mean duration of the index time periods is sequentially computed at the end of the respective intervening time periods which are classified as index time periods, and the current computed mean index time period is stored over the previously stored mean index time period.

6. A method as claimed in claim 1 in which the method comprises the further step of reading the time at commencement of testing of a batch of the components, computing a set-up time period for the test apparatus for the batch of the components, the set-up time period being computed as being a time period from the time at commencement of testing of the batch of the components up to the time at completion of testing of the first of the components tested to be passed as complying with the requirements for which the components are being tested, and storing the computed set-up time period.

7. A method as claimed in claim 6 in which the time at commencement of testing of the batch of the components is stored.

8. A method as claimed in claim 6 in which the number of the components tested during the set-up time period is computed, and the computed number of the components tested during the set-up time period is stored.

9. A method as claimed in claim 1 in which the duration of a test time period for each component tested and passed is computed, the test time period for each component passed being computed as the time from the time at commencement of testing of the component to the time at completion of testing of the component.

10. A method as claimed in claim 9 in which the mean duration of the test time periods for components passed is sequentially computed at the end of the respective test time periods, and the current computed mean test time period for components passed is stored over the previously stored mean test time period for components passed.

11. A method as claimed in claim 10 in which the mean test time period for the components tested and passed is computed from the commencement of testing of a batch of the components.

12. A method as claimed in claim 1 in which the current number of components tested and passed is computed and stored.

13. A method as claimed in claim 12 in which the current number of components tested and passed is computed as the number of components tested and passed since the commencement of testing of a batch of the components.

14. A method as claimed in claim 1 in which the duration of a test time period for each component tested and failed is computed, the test time period for each component failed being computed as the time from the time at commencement of testing of the component to the time at which the component is failed, and testing of the component is terminated.

15. A method as claimed in claim 14 in which the mean duration of the test time periods for components failed is sequentially computed at the end of the respective test time periods, and the current computed mean test time period for components failed is stored over the previously stored mean test time period for components failed.

16. A method as claimed in claim 15 in which the mean test time period for the components tested and failed is computed from the commencement of testing of a batch of the components.

17. A method as claimed in claim 1 in which the current number of components tested and failed is computed and stored.

18. A method as claimed in claim 17 in which the current number of components tested and failed is computed as the number of components tested and failed since the commencement of testing of a batch of the components.

19. A method as claimed in claim 1 in which the current number of components tested is computed and stored.

20. A method as claimed in claim 19 in which the current number of components tested is computed as the number of components tested since the commencement of testing of a batch of the components.

21. A method as claimed in claim 1 in which the time to complete testing of the components not yet tested of a batch of the components is computed based on the number of components tested during a prior predetermined time period.

22. A method as claimed in claim 21 in which the prior predetermined time period is a time period which terminated immediately before computation commenced of the number of components tested during the prior predetermined time period.

23. A method as claimed in claim 1 in which the data stored by the method is stored for ready retrieval.

24. A method as claimed in claim 1 in which the data stored by the method is stored for subsequent analysis.

25. A method as claimed in claim 1 in which the data stored by the method is stored in comma separated value format.

26. A method as claimed in claim 1 in which the time at commencement of testing of each component is read from the test apparatus.

27. A method as claimed in claim 1 in which the time at completion of the testing of each component is read from the test apparatus.

28. A method as claimed in claim 1 in which the number of components tested is computed from data read from the test apparatus.

29. A method as claimed in claim 1 in which the number of components passed by the test apparatus is computed from data read from the test apparatus.

30. A method as claimed in claim 1 in which the number of components failed by the test apparatus is computed from data read from the test apparatus.

31. A method as claimed in claim 1 in which the data stored by the method is stored in a local directory of the test apparatus.

32. A method as claimed in claim 1 in which the method is for monitoring the performance of test apparatus for testing integrated circuit components.

33. A method as claimed in claim 1 in which the test apparatus comprises a plurality of test sites for simultaneously testing a corresponding number of components.

34. A method as claimed in claim 33 in which the data for each test site is stored separately and is cross-referenced with the test site.

35. A method as claimed in claim 34 in which the test time period varies, depending on the number of components being tested simultaneously in the respective test sites, and the method further stores the test time periods cross-referenced with the number of components being simultaneously tested.

36. A computer program product comprising a computer-readable medium having stored thereon signals representing instructions for one or more computer programs which, when executed on a computer, will perform acts of a method as recited in claim 1 for monitoring performance of test apparatus in testing components.

37. The computer program product of claim 36 wherein said instructions are directly loadable into an internal memory of the computer.

38. A computer program product comprising a computer-readable medium having stored thereon signals representing instructions for one or more computer programs which, when executed on a test apparatus, will cause the test apparatus to perform the steps of the method as claimed in claim 1, for monitoring the performance of test apparatus in testing components.

39. The computer program product of claim 38 wherein said instructions are directly loadable into a memory of the test apparatus.

40. Test apparatus for testing components, the test apparatus comprising a microprocessor for controlling the test apparatus during testing of the components, and a storing means for storing a computer programme for operating the microprocessor for carrying out the method as claimed in claim 1 for monitoring the performance of the test apparatus in testing the components.

41. A device for monitoring the performance of test apparatus in testing components, the device comprising
a reading means for reading the time at commencement of testing of each component by the test apparatus, and for reading the time at completion of testing of each component,
a computing means for computing the duration of intervening time periods between the time at completion of testing of each component and the time at commencement of testing of the next component,
a first comparing means for comparing the duration of each computed intervening time period with a first reference delay period, a first means for classifying each computed intervening time period as a first category delay in response to the first comparing means determining that the duration of the intervening time period exceeds the first reference delay period, a second comparing means for comparing the duration of each computed intervening time period which does not exceed the first reference delay period with a second reference delay period, the second reference delay period being less than the first reference delay period, a second means for classifying each computed intervening time period as a second category delay in response to the second comparing means determining that the duration of the intervening time period is not less than the second reference delay period, and a storing means for storing the duration of each first and second category delay and the time at termination of each first and second category delay as being the time at commencement of testing of the next component to be tested after termination of the respective first and second category delays, the duration, termination time and category of each first and second category delay stored in the storing means being cross-referenced.

* * * * *